(12) United States Patent
Ryskoski

(10) Patent No.: US 6,371,135 B1
(45) Date of Patent: Apr. 16, 2002

(54) METHOD AND APPARATUS FOR REMOVING A PARTICLE FROM A SURFACE OF A SEMICONDUCTOR WAFER

(75) Inventor: Matthew S. Ryskoski, Kyle, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/897,625

(22) Filed: Jul. 2, 2001

(51) Int. Cl.[7] .................................................. B08B 6/00

(52) U.S. Cl. ............................ 134/1.3; 134/1.3; 134/1; 204/571; 204/192.11; 204/193; 438/115

(58) Field of Search ............................... 438/115; 134/1, 134/1.1, 1.2, 1.3; 204/571, 191.11, 191.12

(56) References Cited

U.S. PATENT DOCUMENTS 5,516,369 A * 5/1996 Lur et al. .................... 134/1.3
5,849,093 A * 12/1998 Andra ......................... 134/1.3

OTHER PUBLICATIONS

Chapman, Brian; Glow Discharge Process—Sputtering and Plasma Etching; A Wiley–Interscience Publication, 1980; p. 253.*

* cited by examiner

Primary Examiner—Charles Bowers
Assistant Examiner—Scott B. Geyer
(74) Attorney, Agent, or Firm—Williams, Morgan & Amerson, P.C.

(57) ABSTRACT

A method is described for removing a particle from a surface of a semiconductor wafer. In general, the method involves positioning an electrically conductive surface near the particle to be removed. An electrical charge is created on the electrically conductive surface. A charged particle beam is formed, wherein the charged particle beam includes particles having an electrical charge opposite the electrical charge of the electrically conductive surface. The charged particle beam is directed at the particle to be removed. When struck by the charged particle beam, the particle to be removed absorbs a portion of the charged particles of the charged particle beam and acquires an electrical charge opposite the electrical charge of the electrically conductive surface. A force created between the opposed electrical charges of the particle to be removed and the electrically conductive surface causes the particle to be removed to move from the surface of the semiconductor wafer and toward the electrically conductive surface. Several embodiments of an apparatus for carrying out the method are described.

20 Claims, 3 Drawing Sheets

METHOD AND APPARATUS FOR REMOVING A PARTICLE FROM A SURFACE OF A SEMICONDUCTOR WAFER

BACKGROUND OF THE INVENTION

1. Field of the Invention

This invention relates generally to semiconductor wafer fabrication systems, and, more particularly, to methods and systems for removing particles from surfaces of semiconductor wafers during semiconductor wafer fabrication.

2. Description of the Related Art

Integrated circuits are typically formed by processing several semiconductor wafers as a group or "lot" through a series of wafer fabrication process tools (i.e., "process tools"). Each process tool typically performs a single wafer fabrication operation upon the semiconductor wafers. The integrated circuits formed in this manner are substantially identical to one another. Following wafer fabrication, the integrated circuits are typically subjected to functional testing, then separated. An individual integrated circuit is called a "chip" or a "die." Fully functional die are typically packaged and sold as individual units.

It is well known that small particles (i.e., particulates) which adhere to surfaces of semiconductor wafers during wafer fabrication cause "defects." In general, a "defect" is a flaw resulting from an imperfect manufacturing process. Particulates are present in the ambient air, introduced by processing personnel, suspended in liquids and gasses used during wafer processing, and generated by processing equipment. A defect which prevents an integrated circuit containing the defect from performing its intended function is termed a "catastrophic" or "killer" defect. As catastrophic defects reduce yields of wafer fabrication processes, integrated circuit manufacturers go to great lengths to reduce the number of particulates which may adhere to surfaces of semiconductor wafers during wafer fabrication processes.

In general, the vulnerability of a particular integrated circuit feature to a given defect is inversely proportional to the physical dimensions of the feature. Thus as physical dimensions of integrated circuit features shrink over time, the likelihood that a given particulate will cause a "catastrophic" defect increases over time. It would thus be beneficial to have a system and method for selectively removing particles from surfaces of semiconductor wafers. Employing such a system and method during a wafer fabrication process may increase a yield of the wafer fabrication process.

SUMMARY OF THE INVENTION

A method is described for removing a particle from a surface of a semiconductor wafer. In general, the method involves positioning an electrically conductive surface near the particle to be removed. An electrical charge is created on the electrically conductive surface. A charged particle beam is formed, wherein the charged particle beam includes particles having an electrical charge opposite the electrical charge of the electrically conductive surface. The charged particle beam is directed at the particle to be removed to impart an electrical charge opposite the electrical charge of the electrically conductive surface on the particle. When struck by the charged particle beam, the particle to be removed absorbs a portion of the charged particles of the charged particle beam and acquires an electrical charge opposite the electrical charge of the electrically conductive surface. A force created between the opposed electrical charges of the particle to be removed and the electrically conductive surface causes the particle to be removed to move from the surface of the semiconductor wafer and toward the electrically conductive surface.

The electrically conductive surface may be, for example, a surface of an object formed from an electrically conductive material (e.g., a metal). Alternately, the electrically conductive surface may be a layer of an electrically conductive material (e.g., a metal) formed on an object, wherein the object is formed from an electrically insulating material (e.g., plastic, wood, etc.).

In one embodiment of the method, a positive electrical charge is created on the electrically conductive surface with respect to a reference voltage level. An electron beam is formed, wherein the electron beam includes electrons each having a negative electrical charge with respect to the reference voltage level. The electron beam is directed at the particle. When struck by the electron beam, the particle absorbs a portion of the electrons of the electron beam and acquires a negative electrical charge with respect to the reference voltage level. A force created between the opposed electrical charges of the particle and the electrically conductive surface causes the particle to move from the surface of the semiconductor wafer and toward the electrically conductive surface.

An apparatus is described which embodies the above method. In general, the apparatus includes an electrically conductive surface, a charged particle gun (e.g., an electron gun), and a voltage source. The charged particle gun produces a charged particle beam when activated, wherein the charged particle beam includes particles having a first electrical charge with respect to a reference voltage level. The voltage source is coupled between the electrically conductive surface and the reference voltage level, and creates a second electrical charge on the electrically conductive surface when activated, wherein the second electrical charge is opposite the first electrical charge.

During use, the electrically conductive surface is positioned near the particle to be removed, the voltage source is activated, the charged particle gun is activated, and the charged particle beam is directed at the particle to be removed. When struck by the charged particle beam, the particle to be removed absorbs a portion of the charged particles of the charged particle beam and acquires the first electrical charge, and wherein a force created between the opposed electrical charges of the particle to be removed and the electrically conductive surface causes the particle to be removed to move from the surface of the semiconductor wafer and toward the electrically conductive surface.

BRIEF DESCRIPTION OF THE DRAWINGS

The invention may be understood by reference to the following description taken in conjunction with the accompanying drawings, in which like reference numerals identify similar elements, and in which.

Figure 1:
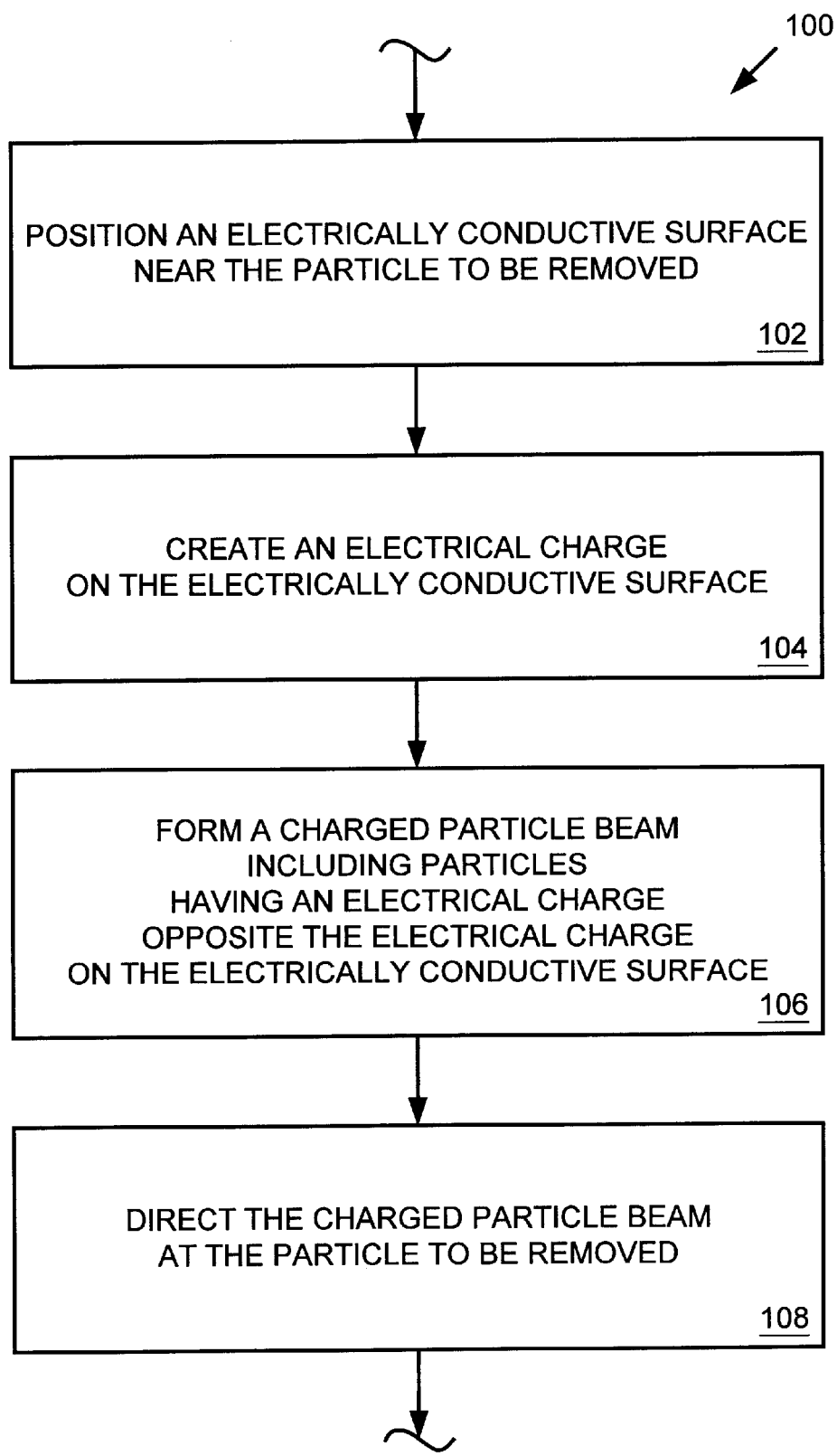
FIG. 1 is a flow chart of one illustrative embodiment of a method in accordance with the present invention for removing a particle from a surface of a semiconductor wafer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will, of course, be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 1 is a flow chart of one illustrative embodiment of a method 100 for removing a particle from a surface of a semiconductor wafer. During step 102 of the method 100, an electrically conductive surface is positioned near the particle to be removed. An electrical charge is created on the electrically conductive surface during step 104. During step 106, a charged particle beam is formed, wherein the charged particle beam includes particles having an electrical charge opposite the electrical charge of the electrically conductive surface. The charged particle beam is directed at the particle to be removed during step 108. When struck by the charged particle beam, the particle to be removed absorbs a portion of the charged particles of the charged particle beam and acquires an electrical charge opposite the electrical charge of the electrically conductive surface. A force created between the opposed electrical charges of the particle to be removed and the electrically conductive surface causes the particle to be removed to move from the surface of the semiconductor wafer and toward the electrically conductive surface.

Figure 2:
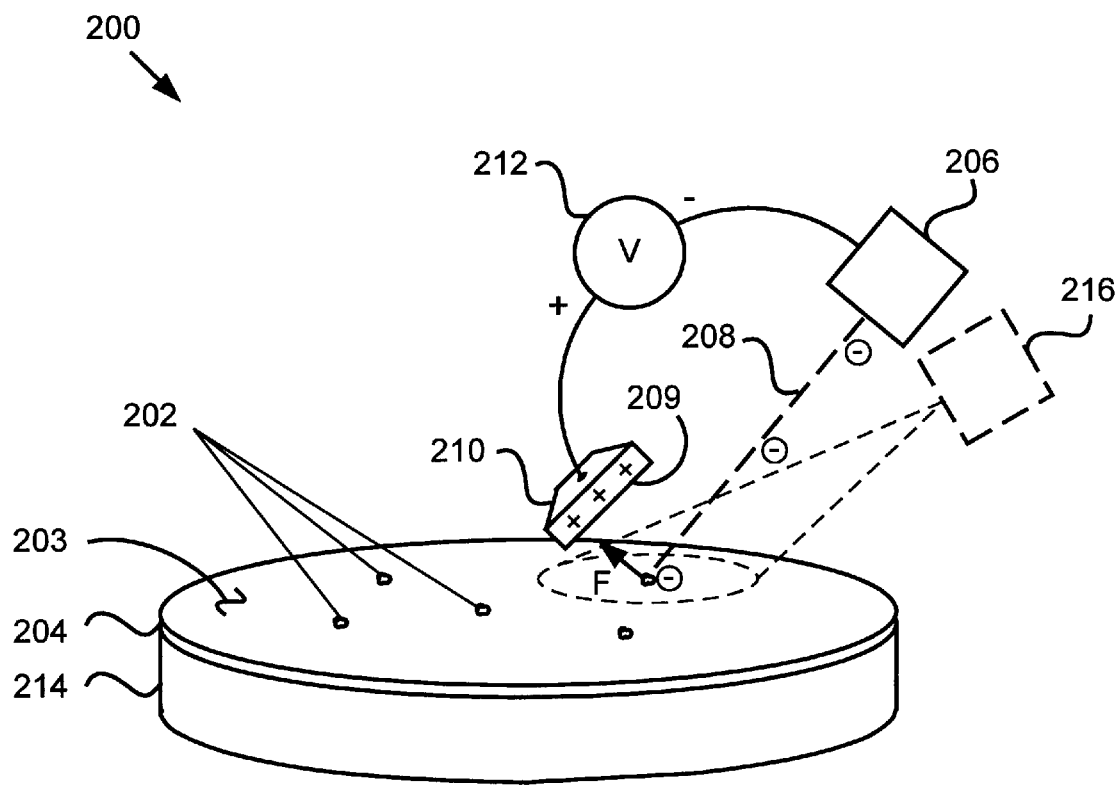
FIG. 2 is a perspective view of one embodiment of a system for carrying out the method of FIG. 1.

FIG. 2 is a perspective view of one embodiment of a system 200 for carrying out the method 100 of FIG. 1. In FIG. 2, several particles 202 are distributed across a frontside surface 203 of a semiconductor wafer 204. As used herein, the phrase "frontside surface of a semiconductor wafer" refers to a major surface of the semiconductor wafer, and any process layers (e.g., layers of electrically conductive and/or insulating materials) formed upon the major surface of the semiconductor wafer. The system 200 includes an electron gun 206 for generating an electron beam 208, an electrically conductive plate 210, and a voltage source 212 coupled between the electron gun 206 and the conductive plate 210. The voltage source 212 creates an electrical voltage between the electron gun 206 and the conductive plate 210 such that the conductive plate 210 is positively charged with respect to a reference voltage level within the electron gun 206. As a result, the conductive plate 210 is also positively charged with respect to the electron beam 208.

In the embodiment of FIG. 2, the system 200 also includes a wafer chuck 214 for holding the semiconductor wafer 204 in place during the particle removal procedure. The semiconductor wafer 204 has two major surfaces: the frontside surface 203, and a backside surface opposite the frontside surface 203. The backside surface of the semiconductor wafer 204 is placed on an upper surface of the wafer chuck 214 as shown in FIG. 2. Mechanical friction between the backside surface of the semiconductor wafer 204 and the upper surface of the wafer chuck 214 may be sufficient to hold the semiconductor wafer 204 in place during the particle removal procedure. Alternately, a vacuum may be created between the upper surface of the wafer chuck 214 and the backside surface of the semiconductor wafer 204 and used to hold the semiconductor wafer 204 in place during the particle removal procedure. Further still, mechanical stops or clamps (not shown) positioned about the outer edges of the wafer chuck 214 may be applied to outer edges of the semiconductor wafer 204 to hold the semiconductor wafer 204 in place during the particle removal procedure.

When one of the particles 202 is selected for removal, a surface 209 of the conductive plate 210 may be positioned near the particle 202 as shown in FIG. 2. The voltage source 212 may then be activated, creating a positive charge on the conductive plate 210 with respect to the reference voltage level within the electron gun 206. The electron gun 206 may then be activated, and the electron beam 208 may be directed at the particle 202 selected for removal as shown in FIG. 2.

When the electrons of the electron beam 208 strike the particle 202, some of the electrons are absorbed by the particle 202. As a result, the particle 202 acquires a negative electrical charge. A force F is developed between the negatively charged particle 202 and the positively charged conductive plate 210. The force F acts on the particle 202 in a direction toward the surface 209 of the conductive plate 210. A component of an adhesion force existing between the particle 202 and the frontside surface 203 of the semiconductor wafer 204 opposes the force F. The particle 202 may be allowed to acquire a sufficient negative charge such that a magnitude of the force F becomes greater than a magnitude of the opposing component of the adhesion force, and the particle 202 moves from the frontside surface 203 of the semiconductor wafer 204 to the surface 209 of the conductive plate 210. Alternately, the conductive plate 210 may be moved closer and closer to the particle 202 until the magnitude of the force F becomes greater than the magnitude of the opposing component of the adhesion force, and the particle 202 moves from the frontside surface 203 of the semiconductor wafer 204 to the surface 209 of the conductive plate 210.

The system 200 may also include an optional imaging subsystem 216. The imaging subsystem 216 may be used to aid in directing the electron beam 208 at the particle 202 selected for removal, and may also be used to determine when the particle 202 has moved from the frontside surface 203 of the semiconductor wafer 204 to the surface 209 of the conductive plate 210. The imaging subsystem 216 may be, for example, an optical imaging subsystem. Alternately, the imaging subsystem may create an image of a portion of the frontside surface 203 of the semiconductor wafer 204 by scanning an electron beam across the portion of the frontside surface 203 of the semiconductor wafer 204, and detecting secondary electrons emitted by surfaces struck by the scanned electron beam.

When directing the electron beam 208 at the particle 202 selected for removal, the position of the wafer chuck 214 may be fixed, and the electron gun 206 may be moved relative to the wafer chuck 214. Alternately, the position of the electron gun 206 may be fixed, and the wafer chuck 214 may be moved relative to the electron gun 206. For example, the wafer chuck 214 may be an "xyz stage" movable in orthogonal x, y, and z directions. The positions of the particles 202 may be obtained in xyz coordinates referenced to a reference point on the frontside surface 203 of the semiconductor wafer 204. In this situation, directing the electron beam 208 at the particle 202 selected for removal may be accomplished by using the x, y, and z coordinates of the particle 202 selected for removal to move the wafer chuck 214 relative to the electron gun 206 such that the particle 202 selected for removal is at a point where the electron beam 208 will strike the frontside surface 203 of the semiconductor wafer 204.

Figure 3:
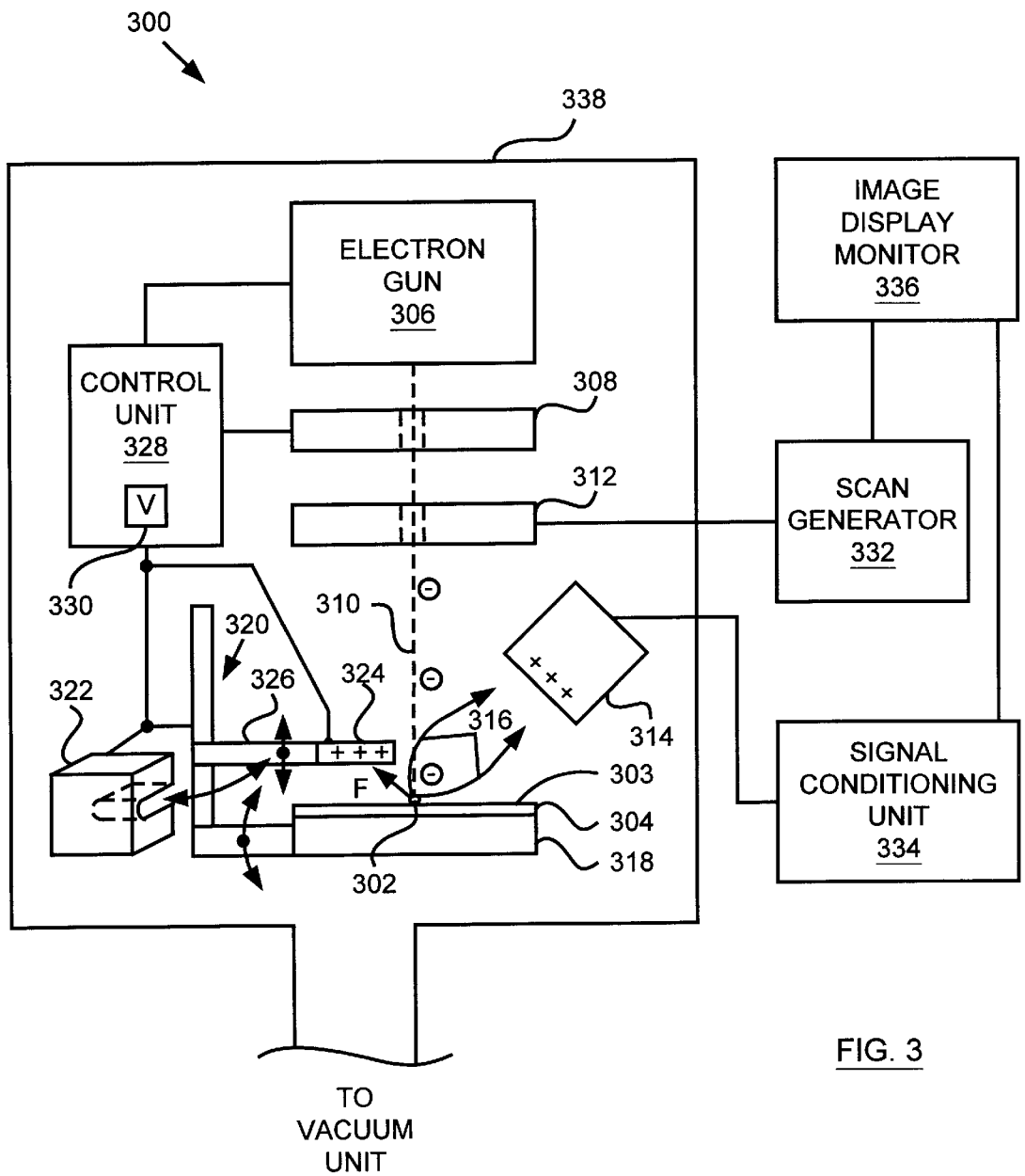
FIG. 3 is a diagram of a another embodiment of a system for carrying out the method of FIG. 1.

FIG. 3 is a diagram of a one embodiment of a system 300 for carrying out the method 100 of FIG. 1. In FIG. 3, a particle 302 is located upon a frontside surface 303 of a semiconductor wafer 304. The system 300 includes an electron gun 306 for generating an electron beam 310 when activated, a condenser coil 308 for focusing the electron beam 310, and a scan coil 312 for scanning the electron beam 310 across a portion of the frontside surface 303 of the semiconductor wafer 304. In FIG. 3, the particle 302 resides within the portion of the frontside surface 303 of the semiconductor wafer 304 scanned by the electron beam 310.

The system 300 also includes a detector 314 for detecting secondary electrons 316 emitted by the portion of the frontside surface 303 of the semiconductor wafer 304 when struck by the electron beam 310. As described above, the particle 302 in FIG. 3 is located on the portion of the frontside surface 303 of the semiconductor wafer 304 scanned by the electron beam 310, and the detector 314 detects secondary electrons 316 emitted by the particle 302 when struck by the electron beam 310. The system 300 also includes a wafer stage 318 for holding the semiconductor wafer 304 in place during a particle removal procedure, a particle removal apparatus 320 connected to the wafer stage 318, a cleaning apparatus 322 for cleaning an electrically conductive tip 324 of a cylindrical rod 326 of the particle removal apparatus 320.

The system 300 also includes a control unit 328. In the embodiment of FIG. 3, the control unit 328 includes a voltage source 330. The voltage source 330 is coupled between the electrically conductive tip 324 of the cylindrical rod 326 and a reference voltage level (e.g., a reference voltage level within the electron gun 306). When activated, the voltage source 330 creates a positive electrical charge on the electrically conductive tip 324 of the cylindrical rod 326 with respect to the reference voltage level. The control unit 328 activates the electron gun 306 and the voltage source 330, and controls the operations of the condenser coil 308, the stage 318, the particle removal apparatus 320, and the cleaning apparatus 322.

The system 300 also includes a scan generator 332 for generating a scan signal for the scan coil 312, a signal conditioning unit 334 for conditioning a signal from the detector 314, and an image display monitor 336 for displaying an image of the portion of the frontside surface 303 of the semiconductor wafer 304. The system 300 also includes a chamber 338 corrected to a vacuum unit and housing the components of the system 300 other than the scan generator 332, the signal conditioning unit 334, and the image display monitor 336. The semiconductor wafer 304 has two major surfaces: the frontside surface 303, and a backside surface opposite the frontside surface 303. During use of the system 300, the backside surface of the semiconductor wafer 304 is placed on an upper surface of the wafer stage 318 as shown in FIG. 3. Mechanical friction between the backside surface of the semiconductor wafer 304 and the upper surface of the wafer stage 318 may be sufficient to hold the semiconductor wafer 304 in place during the particle removal procedure. Alternately, a vacuum may be created between the upper surface of the wafer stage 318 and the backside surface of the semiconductor wafer 304 and used to hold the semiconductor wafer 304 in place during the particle removal procedure. Further still, mechanical stops or clamps (not shown) positioned about the outer edges of the wafer stage 318 may be applied to outer edges of the semiconductor wafer 304 to hold the semiconductor wafer 304 in place during the particle removal procedure.

During operation of the system 300, air is evacuated from the chamber 338 using the vacuum unit to substantially reduce collisions between the electrons of the electron beam 310 and air molecules. The wafer stage 318 is moved relative to the electron gun 306 so that the particle 302 will be within the portion of the frontside surface 303 of the semiconductor wafer 304 scanned by the electron beam 310. For example, the wafer stage 318 may be an "xyz stage" movable in orthogonal x, y, and z directions. The position of the particle 302 may be obtained in xyz coordinates referenced to a reference point on the frontside surface 303 of the semiconductor wafer 304. In this situation, directing the electron beam 310 at the particle 302 may be accomplished by using the x, y, and z coordinates of the particle 302 move the wafer stage 318 relative to the electron gun 306 such that the particle 302 is at a point where the electron beam 208 will strike the frontside surface 303 of the semiconductor wafer 304.

The wafer stage 318 and the connected particle removal apparatus 320 may also rotate within a plane defined by the electron beam 310 and the detector 314 to facilitate positioning of the portion of the frontside surface 303 of the semiconductor wafer 304 scanned by the electron beam 310 relative to the detector 314.

The detector 314, the scan generator 332, the signal conditioning unit 334, and the image display monitor 336 are components of an imaging subsystem. The electron gun 306 and the imaging subsystem may be activated to create an image, displayed upon the image display monitor 336, of the frontside surface 303 of the semiconductor wafer 304 scanned by the electron beam 310. An operator of the system 300 may view the image to verify the particle 302 is within the portion of the frontside surface 303 of the semiconductor wafer 304 scanned by the electron beam 310.

The particle 302 and the portion of the frontside surface 303 of the semiconductor wafer 304 emit secondary electrons 316 when struck by the electron beam 310. The secondary electrons 316 are attracted to the detector 314 via a positive charge developed on the detector 314. The detector 314 uses received secondary electrons 316 to produce a signal which is conditioned (e.g., filtered, amplified, etc.) by the signal conditioning unit 334. The image display monitor 336 uses the scan signal produced by the scan generator 332 and the conditioned signal produced by the signal conditioning unit 334 to display an image of the portion of the frontside surface 303 of the semiconductor wafer 304 scanned by the electron beam 310.

The particle removal apparatus 320 includes the cylindrical rod 326 having the electrically conductive tip 324 mentioned above. The cylindrical rod 326 may be, for example, formed from an electrically insulating material, and the electrically conductive tip 324 may be formed by depositing a layer of an electrically conductive material (e.g., a metal) over one end (i.e., a tip) of the cylindrical rod 326.

During imaging of the portion of the frontside surface 303 of the semiconductor wafer 304 via scanning of the electron beam 310, any positive charge developed on the electrically conductive tip 324 may reduce the number of secondary electrons 316 reaching the detector 314. As a result, during imaging, the control unit 328 may signal the voltage source 330 to connect the conductive tip 324 of the cylindrical rod 326 to a predetermined electrical potential (e.g., the reference voltage level) to reduce the impact of the presence of the conductive tip 324 on the flights of the secondary electrons 316 to the detector 314.

When the operator wishes to remove the particle 302 from the frontside surface 303 of the semiconductor wafer 304, the operator may send a "removal" signal to the control unit 328 (e.g., by pressing a button, closing a switch, etc.). In response to the "removal" signal, the control unit 328 may position the cylindrical rod 326 such that the conductive tip 324 is located near (i.e., slightly above and laterally adjacent to) the particle 302. During positioning of the cylindrical rod 326 and the conductive tip 324, the control unit 328 may signal the voltage source 330 to keep the conductive tip 324 connected to the predetermined electrical potential to reduce the impact of the presence of the conductive tip 324 on the flights of the secondary electrons 316 to the detector 314.

When the conductive tip 324 is in position near the particle 302, the control unit 328 may temporarily deactivate the electron gun 306 and the imaging subsystem. The control unit 328 may then activate the voltage source 330. The activated voltage source 330 creates a positive electrical charge on the conductive tip 324 with respect to the reference voltage level (e.g., within the electron gun 306). The control unit 328 may then reactivate the electron gun 306 for a predetermined period of time, while keeping the imaging subsystem deactivated. During the predetermined period of time, the electron beam 310 is scanned across the portion of the frontside surface 303 of the semiconductor wafer 304.

When the electrons of the scanned electron beam 310 strike the particle 302, some of the electrons are absorbed by the particle 302. As a result, the particle 302 acquires a negative electrical charge. A force F is developed between the negatively charged particle 302 and the positively charged conductive tip 324 as indicated in FIG. 3. The force F acts on the particle 302 in a direction toward the conductive tip 324. It is believed that the negative charge acquired by the particle 302 increases with an amount of time the particle 302 is exposed to the electron beam 310, and thus the force F increases with the amount of time the particle 302 is exposed to the electron beam 310.

A component of an adhesion force existing between the particle 302 and the frontside surface 303 of the semiconductor wafer 304 opposes the force F. If a magnitude of the force F is greater than a magnitude of the opposing component of the adhesion force, the particle 302 expectedly moves from the frontside surface 303 of the semiconductor wafer 304 to a surface of the conductive tip 324. On the other hand, if the magnitude of the force F is less than or equal to the magnitude of the opposing component of the adhesion force, the particle 302 expectedly remains on the frontside surface 303 of the semiconductor wafer 304.

At the end of the predetermined period of time, the control unit 328 may signal the voltage source 330 to connect the conductive tip 324 to the predetermined electrical potential to reduce the impact of the presence of the conductive tip 324 on the flights of the secondary electrons 316 to the detector 314, and reactivate the imaging subsystem. The operator may view an image of the portion of the frontside surface 303 of the semiconductor wafer 304 scanned by the electron beam 310 to verify the presence or absence of particle 302.

If the particle 302 is still present upon the portion of the frontside surface 303, the operator may again generate the "removal" signal to repeat the above process before the negative charge acquired by the particle 302 dissipates. Alternately, or in addition, the operator may signal the control unit 328 to increase the period of time the electron beam 310 is scanned across the portion of the frontside surface 303 of the semiconductor wafer 304 during the removal process. In this situation, the particle 302 expectedly acquires a greater negative charge during the longer exposure period, and the magnitude of the force F is increased. Alternately, or in addition, the operator may signal the control unit 328 to position the conductive tip 324 closer to the particle 302, thus increasing the magnitude of the force F.

When the particle 302 is moved from the frontside surface 303 of the semiconductor wafer 304 to the surface of the conductive tip 324, the operator may send a "clean" signal to the control unit 328. In response to the "clean" signal, the control unit 328 may position the conductive tip 324 of the cylindrical rod 326 within the cleaning apparatus 322. The cleaning apparatus 322 is used to remove the particle 302 form the surface of the conductive tip 324. The cleaning apparatus 322 may include, for example, a chamber dimensioned to receive the conductive tip 324 and a mechanism for subjecting the conductive tip 324 to one or more streams of a gas under pressure when the conductive tip 324 is positioned within the chamber. When the conductive tip 324 is subjected to the one or more streams of gas under pressure, the particle 302 may swept up in the one or more streams and moved away from the conductive tip 324. The cleaning apparatus 322 may also include a mechanism for removing the gas and the particle 302 from the chamber.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for removing a particle from a surface of a semiconductor wafer, comprising:

positioning an electrically conductive surface near the particle to be removed;

creating an electrical charge on the electrically conductive surface;

forming a charged particle beam, wherein the charged particle beam comprises particles having an electrical charge opposite the electrical charge of the electrically conductive surface; and directing the charged particle beam at the particle to be removed to impart an electrical charge opposite the electrical charge of the electrically conductive surface on the particle to be removed, wherein a force created between the opposed electrical charges of the particle to be removed and the electrically conductive surface causes the particle to be removed to move from the surface of the semiconductor wafer and toward the electrically conductive surface.

2. The method as recited in claim 1, wherein the positioning comprises:
   positioning an electrically conductive surface near the particle to be removed, wherein the electrically conductive surface is a surface of an object formed from an electrically conductive material.

3. The method as recited in claim 1, wherein the positioning comprises:
   positioning an electrically conductive surface near the particle to be removed, wherein the electrically conductive surface is a layer of an electrically conductive material formed on an object, and wherein the object is formed from an electrically insulating material.

4. A method for removing a particle from a surface of a semiconductor wafer, comprising:
   positioning an electrically conductive surface near the particle;
   creating a positive electrical charge on the electrically conductive surface with respect to a reference voltage level;
   forming an electron beam, wherein the electron beam comprises electrons each having a negative electrical charge with respect to the reference voltage level; and
   directing the electron beam at the particle, wherein when struck by the electron beam, the particle absorbs a portion of the electrons of the electron beam and acquires a negative electrical charge with respect to the reference voltage level, and wherein a force created between the opposed electrical charges of the particle and the electrically conductive surface causes the particle to move from the surface of the semiconductor wafer and toward the electrically conductive surface.

5. The method as recited in claim 4, wherein the creating comprises:
   activating a voltage source coupled to the electrically conductive surface such that a positive electrical charge is created on the electrically conductive surface with respect to a reference voltage level.

6. The method as recited in claim 4, wherein the forming comprises:
   activating an electron gun and directing an electron beam produced by the electron gun at the particle, wherein the electron beam comprises electrons having a negative electrical charge with respect to the reference voltage level.

7. An apparatus for removing a particle from a surface of a semiconductor wafer, comprising:
   an electrically conductive surface;
   a charged particle gun configured to produce a charged particle beam when activated, wherein the charged particle beam comprises particles having a first electrical charge with respect to a reference voltage level;
   a voltage source coupled between the electrically conductive surface and the reference voltage level, wherein the voltage source is configured to create a second electrical charge on the electrically conductive surface when activated, and wherein the second electrical charge is opposite the first electrical charge;
   wherein during use the electrically conductive surface is positioned near the particle to be removed, the voltage source is activated, the charged particle gun is activated, and the charged particle beam is directed at the particle to be removed; and
   wherein when struck by the charged particle beam, the particle to be removed absorbs a portion of the charged particles of the charged particle beam and acquires the first electrical charge, and wherein a force created between the opposed electrical charges of the particle to be removed and the electrically conductive surface causes the particle to be removed to move from the surface of the semiconductor wafer and toward the electrically conductive surface.

8. An apparatus for removing a particle from a surface of a semiconductor wafer, comprising:
   an electrically conductive surface;
   an electron gun configured to produce an electron beam when activated, wherein the electron beam comprises electrons having a negative electrical charge with respect to a reference voltage level;
   a voltage source coupled between the electrically conductive surface and the reference voltage level, wherein the voltage source is configured to create a positive electrical charge on the electrically conductive surface with respect to the reference voltage level when activated;
   wherein during use the electrically conductive surface is positioned near the particle, the voltage source is activated, the electron gun is activated, and the electron beam is directed at the particle; and
   wherein when struck by the electron beam, the particle absorbs a portion of the electrons of the electron beam and acquires a negative charge with respect to the reference voltage level, and wherein a force created between the opposed electrical charges of the particle and the electrically conductive surface causes the particle to move from the surface of the semiconductor wafer and toward the electrically conductive surface.

9. An apparatus for removing a particle from a surface of a semiconductor wafer, comprising:
   a rod comprising a tip having an electrically conductive surface, wherein the rod is movable about the surface of the semiconductor wafer;
   an electron gun configured to produce an electron beam when activated, wherein the electron beam comprises electrons having a negative electrical charge with respect to a reference voltage level;
   a voltage source coupled between the electrically conductive surface of the tip of the rod and the reference voltage level, and wherein the voltage source is configured to create a positive electrical charge on the electrically conductive surface of the tip of the rod with respect to the reference voltage level when activated;
   a control unit configured to control movement of the rod about the surface of the semiconductor wafer, to activate the voltage source, and to activate the electron gun;
   wherein during use the control unit positions the electrically conductive surface of the tip of the rod near the particle, activates the voltage source, and activates the electron gun; and
   wherein the electron beam is directed at the particle, and wherein when struck by the electron beam, the particle absorbs a portion of the electrons of the electron beam and acquires a negative charge with respect to the reference voltage level, and wherein a force created between the opposed electrical charges of the particle and the electrically conductive surface of the tip of the rod causes the particle to move from the surface of the semiconductor wafer and toward the electrically conductive surface.

10. The apparatus as recited in claim 9, further comprising a stage for holding the semiconductor wafer in place.

11. The apparatus as recited in claim 10, wherein the stage is movable with respect to the electron gun, and wherein the control unit is configured to control movement of the stage.

12. The apparatus as recited in claim 11, wherein a position of the electron gun is fixed, and wherein the electron gun is oriented such that the electron beam is directed at the surface of the semiconductor wafer when activated.

13. The apparatus as recited in claim 12, wherein during use the control unit positions the stage with respect to the electron gun such that the electron beam is directed at the particle.

14. The apparatus as recited in claim 10, further comprising a removal apparatus coupled to the stage, wherein the removal apparatus comprises the rod.

15. The apparatus as recited in claim 9, wherein the rod is formed from an electrically insulating material, and wherein the electrically conductive surface comprises a layer of an electrically conductive material formed on the tip of the rod.

16. The apparatus as recited in claim 9, wherein the opposed electrical charges of the particle and the electrically conductive surface of the tip of the rod causes the particle to move from the surface of the semiconductor wafer to the electrically conductive surface.

17. The apparatus as recited in claim 16, further comprising a cleaning apparatus configured to remove the particle from the electrically conductive surface when activated, wherein the control unit is configured to activate the cleaning apparatus.

18. The apparatus as recited in claim 9, further comprising:

- a condenser coil configured to focus the electron beam produced by the electron gun;
- a scan generator configured to generate a scan signal;
- a scan coil adapted to receive the scan signal and configured to scan the electron beam across a portion of the surface of the semiconductor wafer dependent upon the scan signal;
- a detector configured to detect secondary electrons emitted by the portion of the surface of the semiconductor wafer when struck by the electron beam, and to produce a detector signal in response to the detected secondary electrons;
- a signal conditioning unit adapted to receive the detector signal and configured to condition the detector signal, thereby producing a conditioned detector signal; and
- an image display monitor adapted to receive the scan signal and the conditioned detector signal, and configured to display an image of the portion of the surface of the semiconductor wafer scanned by the electron beam.

19. The apparatus as recited in claim 9, further comprising a chamber housing the semiconductor wafer, the rod, and the electron gun, wherein during use air is evacuated from the chamber.

20. An apparatus for removing a particle from a surface of a semiconductor wafer, comprising:

- means for positioning an electrically conductive surface near the particle to be removed;
- means for creating an electrical charge on the electrically conductive surface;
- means for forming a charged particle beam, wherein the charged particle beam comprises particles having an electrical charge opposite the electrical charge of the electrically conductive surface; and
- means for directing the charged particle beam at the particle to be removed to impart an electrical charge opposite the electrical charge of the electrically conductive surface on the particle to be removed, wherein a force created between the opposed electrical charges of the particle to be removed and the electrically conductive surface causes the particle to be removed to move from the surface of the semiconductor wafer and toward the electrically conductive surface.

* * * * *